United States Patent
Mugiraneza et al.

(10) Patent No.: US 11,785,813 B2
(45) Date of Patent: Oct. 10, 2023

(54) TOUCH-SENSITIVE DISPLAY WITH SHIELDING LAYER

(71) Applicant: SHARP KABUSHIKI KAISHA, Sakai (JP)

(72) Inventors: Jean Mugiraneza, Sakai (JP); Andrew Kay, Oxford (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 217 days.

(21) Appl. No.: 17/242,652

(22) Filed: Apr. 28, 2021

(65) Prior Publication Data

US 2022/0352286 A1 Nov. 3, 2022

(51) Int. Cl.
| | |
|---|---|
| H10K 59/131 | (2023.01) |
| H10K 59/40 | (2023.01) |
| G06F 3/041 | (2006.01) |
| H10K 50/822 | (2023.01) |
| H10K 50/844 | (2023.01) |
| H10K 59/126 | (2023.01) |
| H10K 59/121 | (2023.01) |

(52) U.S. Cl.
CPC ......... *H10K 59/131* (2023.02); *G06F 3/0412* (2013.01); *H10K 50/822* (2023.02); *H10K 50/844* (2023.02); *H10K 59/126* (2023.02); *H10K 59/1213* (2023.02); *H10K 59/40* (2023.02)

(58) Field of Classification Search
CPC ............... H01L 27/3276; H01L 27/323; H01L 27/3262; H01L 27/3272; H01L 51/5225; H01L 51/5253; G06F 3/0412; G06F 3/044; G06F 2203/04107
See application file for complete search history.

(56) References Cited

U.S. PATENT DOCUMENTS

| | | | |
|---|---|---|---|
| 2007/0215888 A1* | 9/2007 | Mitsuhashi | H01L 27/3244 257/94 |
| 2016/0095172 A1* | 3/2016 | Lee | H05B 33/14 313/504 |

\* cited by examiner

*Primary Examiner* — Kyoung Lee
(74) *Attorney, Agent, or Firm* — ScienBiziP, P.C.

(57) ABSTRACT

An organic light-emitting device (OLED) display is provided. The OLED display includes a thin-film transistor (TFT) substrate having a plurality of TFTs and a plurality of data lines that control the plurality of TFTs. The OLED display also includes a conductive shielding layer disposed over the TFT substrate and an OLED layer disposed over the conductive shielding layer. The OLED layer includes a plurality of OLEDs that are driven by the plurality of TFTs. The OLED layer also includes a touch panel layer disposed over the OLED layer. The conductive shielding layer is configured to reduce noise coupling between the TFT substrate and the touch panel layer.

18 Claims, 5 Drawing Sheets

TOUCH-SENSITIVE DISPLAY WITH SHIELDING LAYER

FIELD

The present disclosure generally relates to touch-sensitive displays, and in particular relates to a touch-sensitive display with a shielding layer to reduce noise coupling from display-related devices into touch sensors.

BACKGROUND

In a conventional touch-sensitive display (e.g., touchscreens for smartphones, tablets, etc.), thousands of pixels, each of which may include a plurality of sub-pixels (e.g., a red sub-pixel, a green sub-pixel, and a blue sub-pixel), may be distributed across both horizontal dimensions of the display. In many examples, each sub-pixel may include an organic light-emitting device (OLED), although other types of light sources may be used in other implementations. In many cases, each OLED may be driven by a drive transistor, possibly in conjunction with other transistors. These transistors may be located in a substrate positioned under the OLEDs, and may be controlled by a number of data and/or control lines that indicate the amount of light that each OLED is to emit, as well as the timing of the emission. These data and control lines are typically routed within the substrate in which the transistors are located. In some examples, the transistors may include thin-film transistors (TFTs).

To enable the touch sensitivity functionality of the display, a number of touch sensors may be located in a layer of the display above the OLEDs. The sensors may be arranged in a grid or other two-dimensional patterns such that a particular position on the display touched by a user may be interpreted as user input by the device employing the display.

To enable the display to be thin (e.g., to employ in a user device having a convenient form factor, such as a handheld device), the various layers of the display noted above may be positioned close enough to each other that components of nearby layers may exhibit significant capacitive coupling therebetween. As the current product trend is toward creating progressively thinner devices and associated displays, this capacitive coupling increases, potentially resulting in electrical noise being coupled between those layers, thus possibly resulting in faults in the electrical operation of the device.

SUMMARY

The present disclosure is directed to touch-sensitive display devices (e.g., an OLED display) employing a shielding layer therewithin.

In accordance with one aspect of the present disclosure, an OLED display may include a thin-film transistor (TFT) including a plurality of TFTs and a plurality of data lines that control the plurality of TFTs. The OLED may also include a conductive shielding layer disposed over the TFT substrate, and OLED layer disposed over the conductive shielding layer, and a touch panel layer disposed over the OLED layer. The OLED layer may include a plurality of OLEDs that are driven by the plurality of TFTs. The conductive shielding layer may be configured to reduce noise coupling between the TFT substrate and the touch panel layer.

In an implementation of the first aspect, the conductive shielding layer may be held at a direct-current (DC) bias voltage. In another implementation of the first aspect, the conductive shielding layer may be capacitively coupled with at least one of the plurality of data lines.

In yet another implementation of the first aspect, the plurality of OLEDs may include at least one cathode electrode that carries return current from the plurality of OLEDs. In such an implementation, the at least one cathode electrode may include a single conductive layer coupling multiple ones of the plurality of OLEDs. Further, in some examples, the at least one cathode electrode may be capacitively coupled with the conductive shielding layer. Also, in such an implementation, the at least one cathode electrode may have a first resistivity, and the conductive shielding layer may have a second resistivity lower than the first resistivity. Additionally, in such an implementation, the at least one cathode electrode and the conductive shielding layer may be held at a first DC voltage.

In yet another implementation of the first aspect, the OLED layer may further include an encapsulation layer disposed over the at least one cathode electrode, and the touch panel layer may be deposited atop the encapsulation layer. In some examples, the encapsulation layer may include a thin-film encapsulation (TFE) layer.

In another implementation of the first aspect, the touch panel layer may include at least one touch panel electrode, and the at least one touch panel electrode may be capacitively coupled with the at least one cathode electrode. In such an implementation, the at least one touch panel electrode may form a pattern across two dimensions within the touch panel layer.

In another implementation of the first aspect, the conductive shielding layer may include a plurality of traces extending parallel to the TFT substrate. In such an implementation, each of the plurality of traces may be positioned vertically over and aligned with at least a portion of at least one of the plurality of data lines.

In accordance with a second aspect of the present disclosure, a method of constructing an OLED display may include forming a conductive shielding layer over a thin-film transistor (TFT) substrate. The TFT substrate may include a plurality of TFTs and a plurality of data lines that control the plurality of TFTs. The method may also include forming an OLED layer over the conductive shielding layer and forming a touch panel layer disposed over the OLED layer. The OLED may include a plurality of OLEDs that are driven by the plurality of TFTs. The conductive shielding layer may be configured to reduce noise coupling between the TFT substrate and the touch panel layer.

In an implementation of the second aspect, forming the OLED layer may include forming at least one cathode electrode to the plurality of OLEDs to carry return current from the plurality of OLEDs, where the conductive shielding layer is capacitively coupled to the at least one cathode electrode. Further, in such an implementation, the method may further include connecting the conductive shielding layer to a direct-current (DC) bias voltage source. The method may further include connecting the at least one cathode electrode to the DC bias voltage source.

In another implementation of the second aspect, the conductive shielding layer may be capacitively coupled with the plurality of data lines. In such an implementation, forming the conductive shielding layer may include forming a plurality of traces extending parallel to the TFT substrate, and each of the plurality of traces may be placed vertically over and aligned with at least a portion of at least one of the plurality of data lines.

BRIEF DESCRIPTION OF DRAWINGS

Aspects of the example disclosure are best understood from the following detailed description when read with the accompanying figures. Various features are not drawn to scale. Dimensions of various features may be arbitrarily increased or reduced for clarity of discussion.

DESCRIPTION

Figure 1:
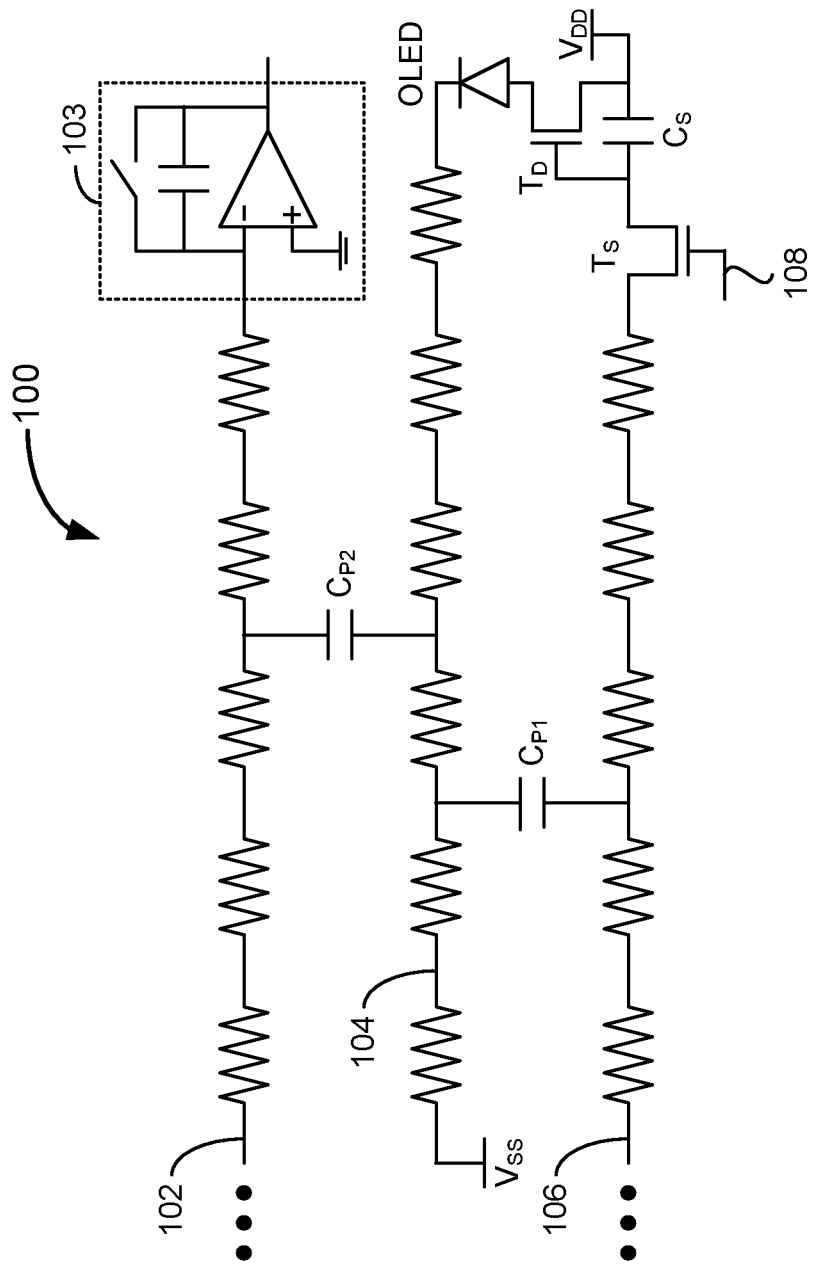
FIG. 1 is a schematic model of a portion of a related-art OLED display.

The following description contains specific information pertaining to exemplary implementations in the present disclosure. The drawings and their accompanying detailed description are directed to exemplary implementations. However, the present disclosure is not limited to these exemplary implementations. Other variations and implementations of the present disclosure will occur to those skilled in the art. Unless noted otherwise, like or corresponding elements in the figures may be indicated by like or corresponding reference numerals. Moreover, the drawings and illustrations are generally not to scale and are not intended to correspond to actual relative dimensions.

For consistency and ease of understanding, like features are identified (although, in some examples, not shown) by numerals in the exemplary figures. However, the features in different implementations may be different in other respects, and therefore will not be narrowly confined to what is shown in the figures.

The phrases "in one implementation" and "in some implementations" may each refer to one or more of the same or different implementations. The term "coupled" is defined as connected, whether directly or indirectly via intervening components, and is not necessarily limited to physical connections. The term "comprising" means "including, but not necessarily limited to" and specifically indicates open-ended inclusion or membership in the described combination, group, series, and equivalent.

Additionally, any two or more of the following paragraphs, (sub)-bullets, points, actions, behaviors, terms, alternatives, examples, or claims described in the following disclosure may be combined logically, reasonably, and properly to form a specific method. Any sentence, paragraph, (sub)-bullet, point, action, behavior, term, or claim described in the following disclosure may be implemented independently and separately to form a specific method. Dependency, e.g., "according to", "more specifically", "preferably", "in one embodiment", "in one implementation", "in one alternative", etc., in the following disclosure refers to just one possible example which would not restrict the specific method.

For explanation and non-limitation, specific details, such as functional entities, techniques, protocols, and standards, are set forth for providing an understanding of the described technology. In other examples, detailed description of well-known methods, technologies, systems, and architectures are omitted so as not to obscure the description with unnecessary details.

Also, while certain directional references (e.g., top, bottom, up, down, height, width, and so on) are employed in the description below and appended claims, such references are utilized to provide guidance regarding the positioning and dimensions of various elements relative to each other and are not intended to limit the orientation of the various embodiments to those explicitly discussed herein.

Various embodiments of an OLED display that are described below may reduce or inhibit the coupling of electrical noise between two or more portions of the display. In at least some examples, a conductive shielding layer may be incorporated within the display to electrically isolate touch sensors of the display from potential sources of electrical noise in the display.

FIG. 1 is a schematic model of a portion of a related-art OLED display 100. As depicted in FIG. 1, OLED display 100 may include a plurality of transistors (e.g., TFTs) that drive a light-emitting device (e.g., an OLED) to emit a desired intensity of light during a particular period of time. OLED display 100 may include multiple OLEDs arranged in a grid or array of multiple rows and columns to generate images for viewing. More specifically, the OLEDs may be configured as an array of pixels, with each pixel possibly including a number of sub-pixels (e.g., each sub-pixel for emitting red, green, or blue light, as emitted by a corresponding OLED). However, a single OLED is depicted in FIG. 1 to simplify the discussion of OLED display 100.

The amount or intensity of light emitted by the OLED may be controlled by way of an amount of electrical current passed through the OLED from a first power supply voltage $V_{DD}$ by way of a drive transistor $T_D$. In turn, that amount of current may be determined by a particular voltage potential placed across a gate terminal and a second terminal of drive transistor $T_D$. In FIG. 1, this voltage may be stored by a storage capacitor $C_S$ that may be charged by way of a switching transistor $T_S$ that temporarily connects one plate of storage capacitor $C_S$ to a data line 106 that provides the voltage level associated with the desired illuminance of the OLED during a particular time period. In turn, switching transistor $T_S$ may be controlled (e.g., turned on and off) by a scan signal 108. While the schematic model of FIG. 1 depicts a single switching transistor $T_S$ in addition to drive transistor $T_D$, other examples may include additional switching transistors and/or other components that receive data and control signals for supplying electrical current to the OLED to emit light.

In some examples, each column of OLEDs may be driven by the same data line 106 for that column, and each row of OLEDs may be controlled by way of the same scan signal 108 for that row. Consequently, each scan signal 108 may simultaneously transfer the voltages from all data lines 106 to their corresponding OLEDs in the row serviced by that scan signal 108. As each data line 106 services a corresponding OLED in each row, data lines 106 are potentially changing voltage every period of time assigned to each row of OLEDs, and thus may represent a significant potential source of electrical noise that may adversely affect other portions of OLED display 100, as described below. Additionally, other signals that change voltages periodically, such as scan signal 108, may also be sources of electrical noise.

In at least some embodiments, the plurality of transistors $T_D$ and $T_S$, data lines 106, scan lines 108, and the like may form a TFT layer or substrate within OLED display 100, as indicated in FIG. 1. Located above the TFT substrate may be an OLED layer that includes the OLEDs being driven by corresponding drive transistors $T_D$. As illustrated in FIG. 1, the anode of each OLED may be connected to a terminal of a corresponding drive transistor $T_D$, and a cathode of each OLED may be electrically connected to a second power supply voltage $V_{SS}$ having a lower voltage than first power supply voltage $V_{DD}$. Further, in some embodiments, as the cathode of each OLED may be connected to the same second power supply voltage $V_{SS}$, the cathode of multiple OLEDs may be coupled through a single cathode electrode 104 to second power supply voltage $V_{SS}$. In some examples, single cathode electrode 104 may service all or substantially all OLEDs of OLED display 100 and be fashioned as a continuous sheet or layer of conductive material.

Also shown in FIG. 1, located over the OLED layer may be a touch panel layer (e.g., in an "on-cell" configuration) that may include at least one touch electrode 102 that is coupled with a charge integrator 103. In some examples, charge integrator 103 may be configured to detect a change in capacitance related to touch electrode 102 that may indicate proximity of a user finger, stylus, or the like to touch electrode 102. In the example of FIG. 1, charge integrator 103 may include an operational amplifier with a capacitor and a switch (e.g., a transistor). However, another type of charge integrator 103, or another type of circuit not discussed herein, may be configured to employ touch electrode 102 to detect user or stylus proximity.

To enable relatively fine resolution as to a location at which proximity is detected over the entirety of OLED display 100, multiple touch electrodes 102 may be distributed over OLED display 100. For example, multiple touch electrodes 102 may be arranged as conductive lines extending along two directions within OLED display 100, such as in a rectangular or diagonal (e.g., diamond-shaped) pattern that substantially extends through the entirety of OLED display 100.

As illustrated in FIG. 1, the one or more touch electrodes 102 of the touch panel layer, the one or more OLED cathode electrodes 104 of the OLED layer, and data lines 106 of the TFT substrate may form closely spaced parallel conductors that operate as parasitic capacitances. Further, in some examples, with OLED cathode electrode 104 often being configured as a continuous or near-continuous conductive sheet, capacitive coupling may be significant between data lines 106 and the one or more OLED cathode electrodes 104, as well as between the one or more OLED cathode electrodes 104 and the one or more touch electrodes 102. In FIG. 1, these capacitances are depicted as a first parasitic capacitance $C_{P1}$ between data lines 106 and the one or more OLED cathode electrodes 104 and a second parasitic capacitance $C_{P2}$ between the one or more OLED cathode electrodes 104 and the one or more touch electrodes 102.

As is also shown in the schematic model of FIG. 1, as each of the one or more touch electrodes 102, the one or more OLED cathode electrodes 104, and data lines 106 are conductors, each such conductor may possess some small, but measurable, resistance (e.g., less than 1 ohm) along a length thereof within their corresponding layers of OLED display 100. This resistance, in combination with parasitic capacitances $C_{P1}$ and $C_{P2}$, may result in electrical noise being induced in one or more of the conductors. More specifically, in some examples, a change in voltage in data line 106 of the TFT substrate may result in a change in voltage across first parasitic capacitance $C_{P1}$, which in turn may alter an amount of charge stored at both conductors (e.g., data line 106 and OLED cathode electrode 104) that are capacitively coupled by first parasitic capacitance $C_{P1}$. To facilitate this change in charge at OLED cathode electrode 104, an electrical current may temporarily flow in OLED cathode electrode 104. This current, by flowing through the small resistance possessed by OLED cathode electrode 104, may result in a temporary voltage variation (e.g., electrical noise) from second power supply $V_{SS}$ at one or more points along OLED cathode electrode 104.

Moreover, as can be seen in the schematic model of OLED display 100 in FIG. 1, the voltage variation in OLED cathode electrode 104 may result in a change in voltage across second parasitic capacitance $C_{P2}$, which in turn may alter an amount of charge stored at both conductors (e.g., OLED cathode electrode 104 and touch electrode 102) that are capacitively coupled by second parasitic capacitance $C_{P2}$. To facilitate this change in charge at touch electrode 102, an electrical current may temporarily flow in touch electrode 102. This current, by flowing through the small resistance possessed by touch electrode 102, may result in a temporary voltage variation, and thus electrical noise, at touch electrode 102. This noise, in turn, may adversely affect the proximity detection function of charge integrator 103, or another proximity detection circuit that may be employed in conjunction with touch electrode 102. For example, false positive or negative proximity events may occur from this coupled noise.

Figure 2:
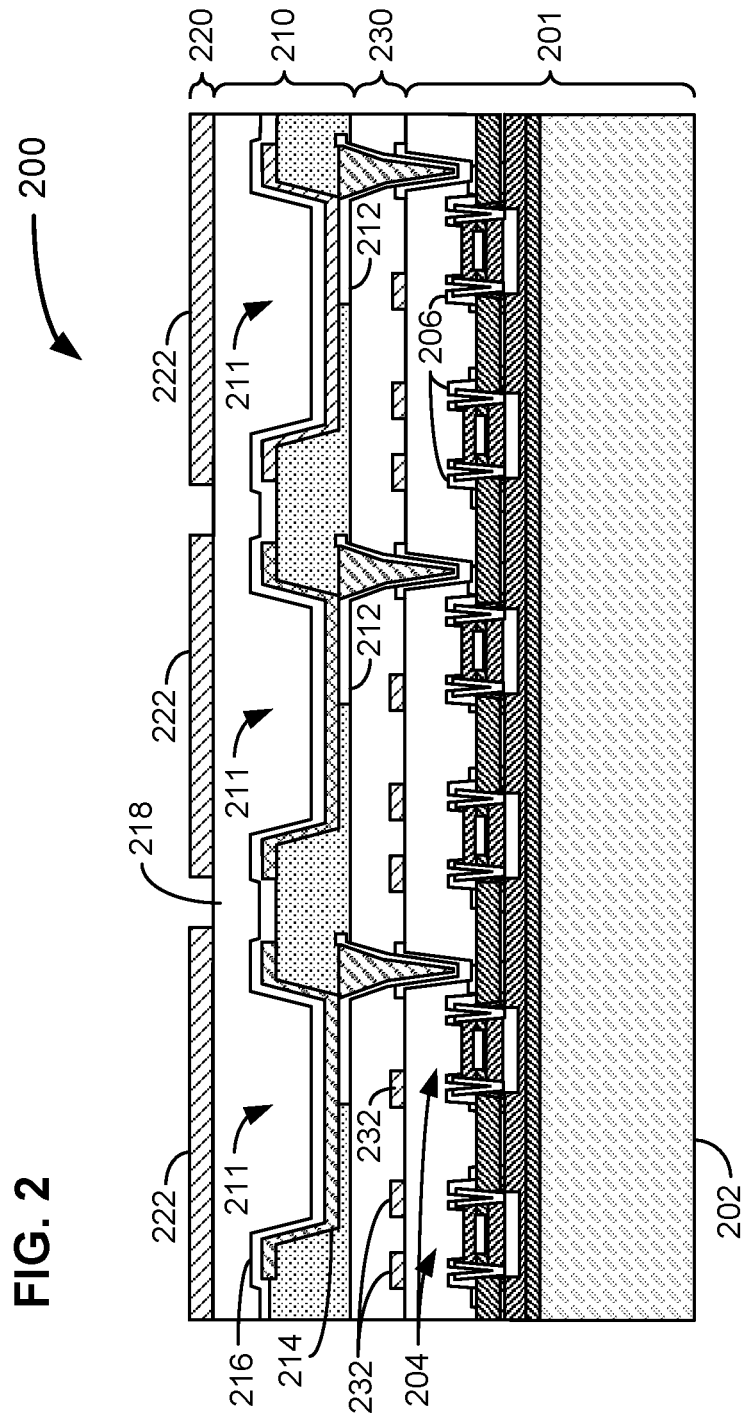
FIG. 2 is a cross-sectional view of a portion of an OLED display that includes a conductive shielding layer, in accordance with an example implementation of the present disclosure.

FIG. 2 is a cross-sectional view of a portion of an OLED display 200 that includes a conductive shielding layer 220, in accordance with an example implementation of the present disclosure. While FIG. 2 provides a view of a particular portion of one embodiment of OLED display 200, other embodiments may appear somewhat different while remaining within the scope of the claims presented below. Also, while various layers of OLED display 200 are discussed below, other layers or sublayers may be incorporated within OLED display 200, such as various insulative or dielectric layers or sublayers, but such components are not described further herein for simplicity of discussion.

As depicted in FIG. 2, OLED display 200 may have a TFT substrate 201 that may include a plurality of TFTs 204. TFT substrate 201 may also include a bottom substrate 202 (e.g., made of glass or other structurally stable material) upon which multiple thin-film layers may be deposited to form the plurality of TFTs 204. In some embodiments, TFT substrate 201 may also include a plurality of data lines 206 (e.g., signal lines for data indicating a desired OLED luminance level). In the example of FIG. 2, data lines 206 are shown at connection points with multiple TFTs 204.

Located or disposed above TFT substrate 201 may be a conductive shielding layer 230. In this particular example, conductive shielding layer 230 may include multiple conductive traces 232 or lines that are located over, and (substantially) aligned with, data lines 206, thus possibly forming a mesh. In other embodiments, conductive shielding layer 230 may be more continuous, and thus cover more area of TFT substrate 201. Also, in some embodiments, conductive traces 232 may be connected to with a particular direct-current (DC) bias voltage.

Located above conductive shielding layer 230 may be an OLED layer 210 that includes a plurality of OLEDs 211. In one embodiment, each OLED 211 depicted in FIG. 1 may be a sub-pixel associated with a corresponding color (e.g., red, green, or blue) of a pixel of OLED display 200. Each OLED 211 may include an anode electrode 212 that is coupled to a terminal of a drive TFT 204 (e.g., serving as drive transistor $T_D$ of FIG. 1) by way of a connection through conductive shielding layer 230. Each OLED 211 may also include an emissive layer 214 that emits the desired light from OLED 211. Also, OLEDs 211 may include a cathode electrode 216 that is used in conjunction with anode electrode 212 to pass electrical current through emissive layer 214 under the control of the drive TFT 204. While each OLED 211 possesses a corresponding separate anode electrode 212, all, or some subset of, OLEDs 211 may share a single cathode electrode 216, as depicted in FIG. 2. Also, in some embodiments, as part of OLED layer 210, OLEDs 211 may be covered with an encapsulation layer, such as a thin-film encapsulation (TFE) layer 218, to protect OLEDs 211 from water and other environmental effects.

OLED 200 may also include a touch panel layer 220 that may include a plurality of touch sensor electrodes 222 (e.g., each serving as touch electrode 102 of FIG. 1) that are disposed atop OLED layer 210. While a single layer of touch sensor electrodes 222 is depicted in FIG. 2, two or more such layers may be employed in other examples. Touch sensor electrodes 222, in some embodiments, may be coupled to one or more touch sensing circuits (e.g., charge integrator 103 of FIG. 1). An additional protective layer (e.g., glass, which is not shown in FIG. 2) may be disposed atop touch panel layer 220 in some examples. As described in greater detail below, conductive shielding layer 230 may reduce the amount of electrical noise coupled from TFT substrate 201 into touch panel layer 220.

Figure 3:
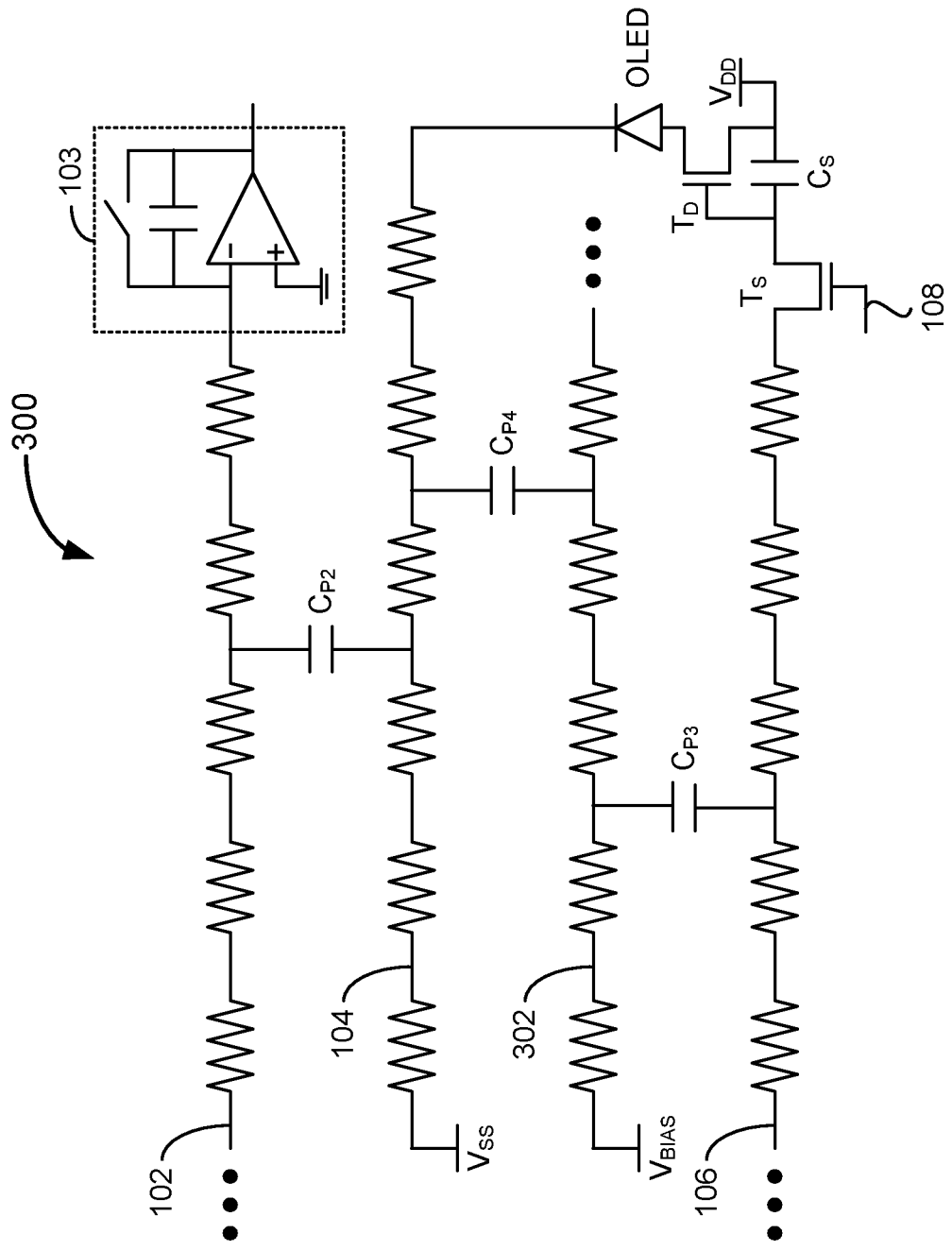
FIG. 3 is a schematic model of a portion of an OLED display that includes a conductive shielding layer, in accordance with an example implementation of the present disclosure.

FIG. 3 is a schematic model of a portion of an OLED display 300 that includes a conductive shielding layer (e.g., serving as conductive shielding layer 230 of FIG. 2), in accordance with an example implementation of the present disclosure. Other components of OLED display 300 are similar to those corresponding components of OLED display 100 of FIG. 1. In FIG. 3, located between data line 106 and OLED cathode electrode 104 lies conductive shielding 302 (e.g., serving as conductive trace 232 of FIG. 2). In some embodiments, conductive shielding 302 may be aligned with, and be located (directly) over, data line 106. Further, a single conductive shielding 302 may be located over each of a plurality of data lines 106 of OLED display 300, or each individual conductive shielding 302 may be sized and positioned over multiple data lines 106. In yet other examples, conductive shielding 302 may represent a single conductive sheet, as opposed to one or more traces, to cover substantially all data lines 106 of OLED display 300. Further, in some embodiments, conductive shielding 302 may also be positioned over other control signals (e.g., scan signals, emission signals, and so) that drive one or more TFTs, such as switching transistor $T_S$. In each case, each conductive shielding 302 may be connected to a DC bias voltage $V_{BIAS}$ (e.g., to reduce the amount of voltage variation that may occur along conductive shielding 302).

Consequently, instead of parasitic capacitance CPI coupling data line 106 and OLED cathode electrode 104, as illustrated in FIG. 1, conductive shielding 302 of OLED display 300 may be capacitively coupled to data line 106 by parasitic capacitance $C_{P3}$. Further, conductive shielding 302 may also be capacitively coupled to OLED cathode electrode 104 by parasitic capacitance $C_{P4}$. As discussed above, this capacitive coupling may occur from data line 106, conductive shielding 302, and OLED cathode electrode 104 substantially forming closely spaced conductive plates. Additionally, conductive shielding 302 may possess some small, but measurable, resistance (e.g., less than 1 ohm) along a length of conductive shielding 302, in a manner similar to data line 106 and touch electrode 102, as described above with reference to FIG. 1.

Given the schematic model of FIG. 3, conductive shielding 302 may serve to reduce electrical noise coupling between data line 106 and OLED cathode electrode 104, thus reducing the amount of electrical noise injected into touch electrode 102. More specifically, a change in voltage of data line 106 (e.g., when transitioning from a data voltage for an OLED of one row to the data voltage for a corresponding OLED of a subsequent row) may cause a change in electrical charge on both sides of parasitic capacitance $C_{P3}$ (e.g., at data line 106 and conductive shielding 302). This change in charge may cause electrical current to flow in conductive shielding 302, along with an accompanying change in voltage at conductive shielding 302 due to the current flowing through the small resistance of conductive shielding 302.

A noise coupling effect may also occur between conductive shielding 302 and OLED cathode electrode 104 by way of parasitic capacitance $C_{P4}$, where the change in voltage at conductive shielding 302 may induce a change in voltage, representing electrical noise, in OLED cathode electrode 104. However, by introducing an additional conductive layer in the form of conductive shielding 302, some of the present embodiments may reduce overall noise coupling between data line 106 and OLED cathode electrode 104 in OLED display 300 compared to OLED display 100. For example, the overall positioning and configuration of conductive shielding 302 may result in parasitic capacitance $C_{P4}$ being less than parasitic capacitance $C_{P3}$, resulting in less overall electrical noise being passed to OLED cathode electrode 104.

Additionally, given that conductive shielding 302 may have fewer design constraints enforced thereon compared to either data line 106 or OLED cathode electrode 104, conductive shielding 302 may be configured or adapted to further reduce the amount of noise coupled from data line 106 to OLED cathode electrode 104. For example, conductive shielding 302 may be formed such that its resistivity (e.g., in units of ohm-meters) may be less than a resistivity of OLED cathode electrode 104. This difference in resistivity, in some embodiments, may result in a smaller change in voltage of conductive shielding 302 of OLED display 300 relative to that imposed on OLED cathode electrode 104 of OLED display 100 of FIG. 1, resulting in less current being induced in OLED cathode electrode 104 of OLED display 300.

Figure 4:
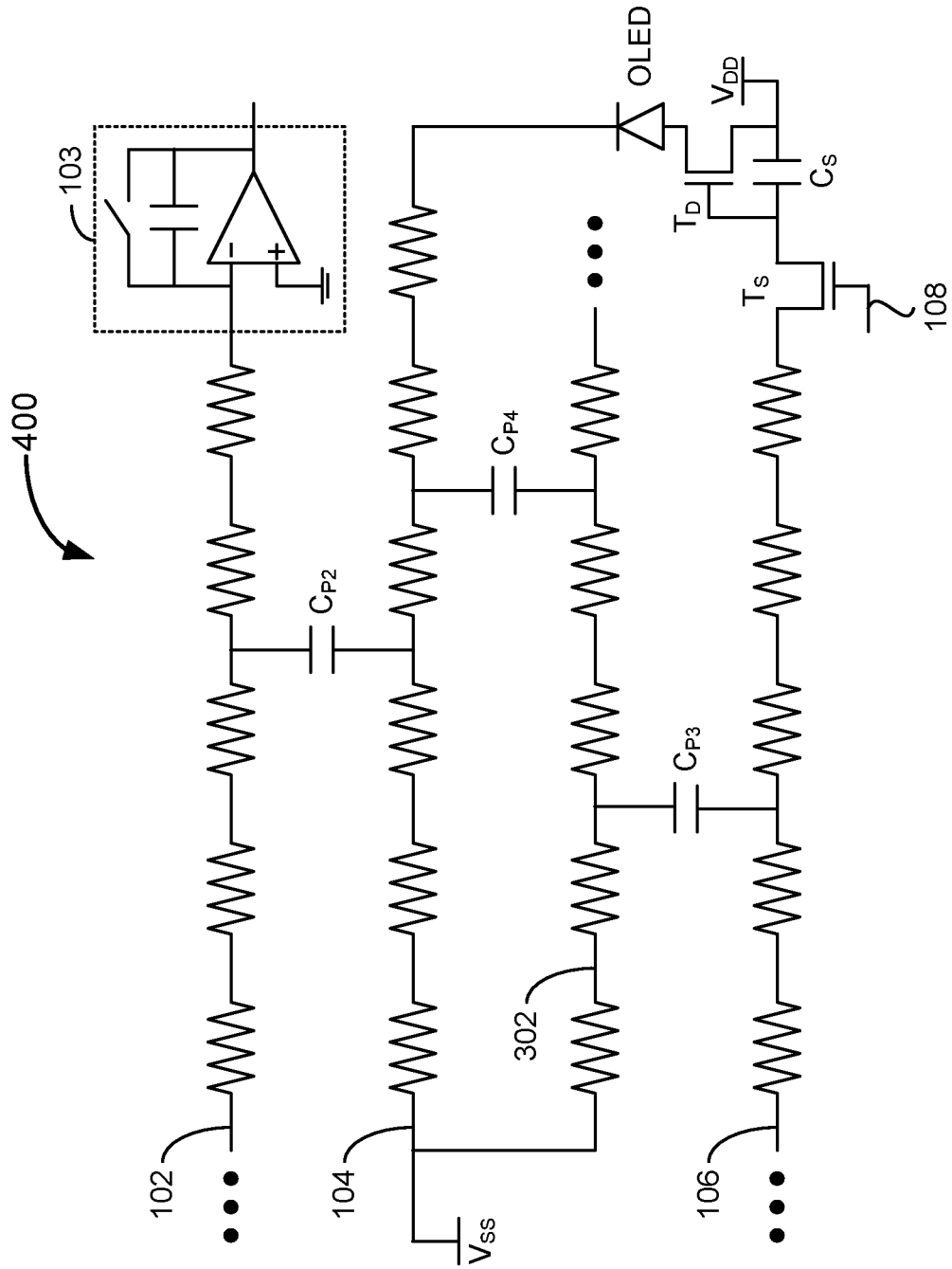
FIG. 4 is a schematic model of a portion of an OLED display that includes a conductive shielding layer, in accordance with another example implementation of the present disclosure.

Also, in some embodiments, a selection of bias voltage VBIAS for conductive shielding 302 may be made to lessen the amount of electrical current induced in OLED cathode electrode 104. FIG. 4 is a schematic model of a portion of an OLED display 400 that includes conductive shielding 302, in accordance with another example implementation of the present disclosure. In OLED display 400, conductive shielding 302 is connected to substantially the same voltage supply as OLED cathode electrode 104 (e.g., second supply voltage $V_{SS}$). Consequently, in this example, a local change in voltage on conductive shielding 302 may result in a relatively small voltage change across parasitic capacitance $C_{P4}$, thus resulting in a relatively small current flow and associated voltage change in OLED cathode electrode 104 compared to other configurations in which conductive shielding 302 is connected to other DC voltage levels different from $V_{SS}$.

Figure 5:
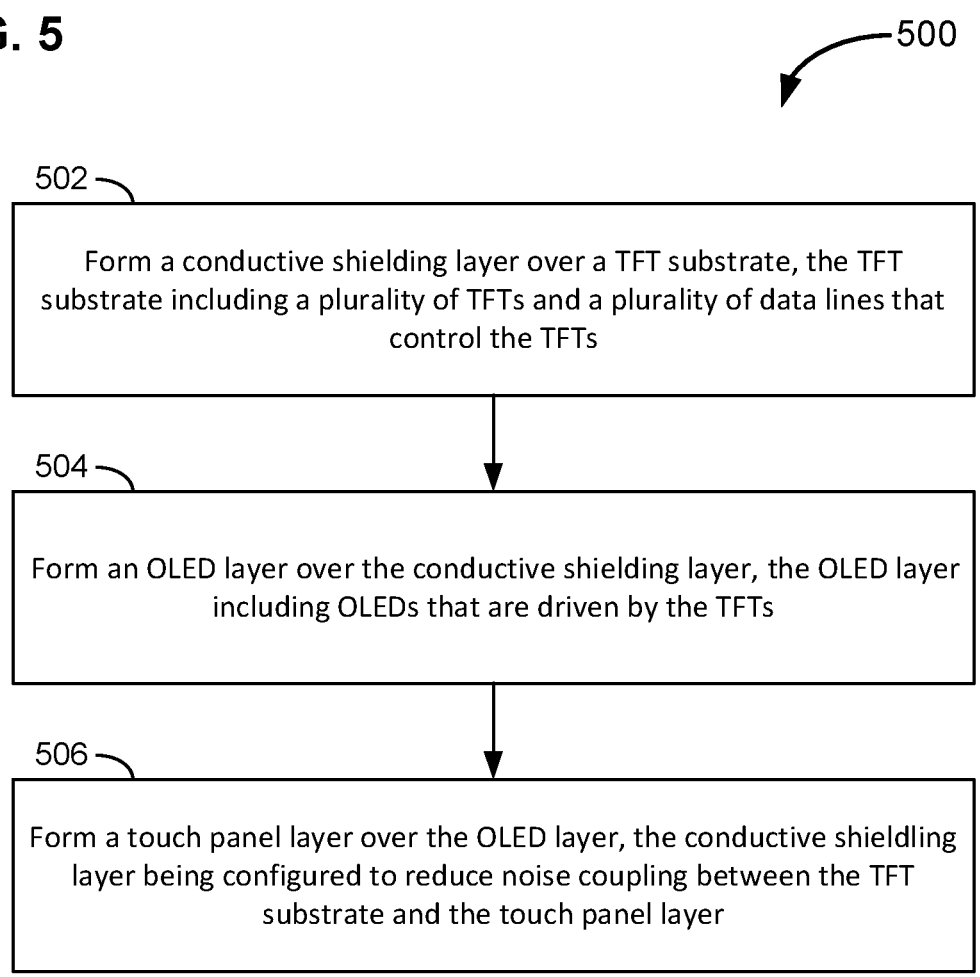
FIG. 5 is a flow diagram of a method of constructing an OLED display that includes a conductive shielding layer, in accordance with an example implementation of the present disclosure.

FIG. 5 is a flow diagram of a method 500 of constructing an OLED display (e.g., OLED display 200) that includes a conductive shielding layer (e.g., conductive shielding layer 230 of FIG. 2), in accordance with an example implementation of the present disclosure. As described below, method 500 presumes that various layers of the OLED display are formed from the bottom up, as such layers are depicted in OLED display 200. Other orders by which the various layers are created and combined may be implemented in other examples.

In method 500, at operation 502, a conductive shielding layer may be formed over a TFT substrate (e.g., TFT substrate 201 of FIG. 2). The TFT substrate may include a plurality of TFTs (e.g., TFTs 204 of FIG. 2) and a plurality of data lines (e.g., data lines 206 of FIG. 2) that control the TFTs. In turn, in some embodiments, the TFT substrate may be created by depositing various thin-film layers to create the plurality of TFTs over a mechanically stable substrate (e.g., substrate 202 of FIG. 2). As discussed above, the conductive shielding layer may include a single conductive sheet extending parallel to the TFT substrate. In other examples, the conductive shielding layer may include a plurality of conductive traces (e.g., conductive traces 232 of FIG. 2) that extend parallel to the TFT substrate, which may form a network or mesh over the TFT substrate. Further, the conductive traces may be placed vertically over, and aligned in parallel with, at least some of the data lines and/or other control signals coupled with the TFTs of the TFT substrate. As a result, the conductive shielding layer may be capacitively coupled with at least some of the data lines and/or other control signals. In addition, the conductive shielding layer may be connected to a DC bias voltage source.

Also in method 500, at operation 504, an OLED layer (e.g., OLED layer 210 of FIG. 2) may be formed over the conductive shielding layer. The OLED layer may include a plurality of OLEDs (e.g., OLEDs 211 of FIG. 2) that are driven by the plurality of TFTs of the TFT substrate. As shown in FIG. 2, each of the OLEDs may be formed by layers serving as an anode electrode (e.g., anode electrode 212 of FIG. 2) that is connected with a corresponding drive TFT, as well as an emissive layer (e.g., emissive layer 214 of FIG. 2). Each anode electrode may provide current from its corresponding drive TFT to the associated OLED. In addition, a single cathode electrode (e.g., cathode electrode 216) or a plurality of cathode electrodes may be formed over substantially all, or some subset of, the foregoing layers of the OLEDs to carry return electrical current from the OLEDs to a power supply voltage (e.g., power supply voltage $V_{SS}$). In some embodiments, the DC bias voltage of the conductive shielding layer may be the same power supply voltage coupled to the one or more OLED cathode electrodes. In some embodiments, an additional encapsulation layer (e.g., TFE layer 218 of FIG. 2) may protect the underlying OLEDs and provide a planar surface upon which additional structures may be formed.

At operation 506 of method 500, a touch panel layer (e.g., touch panel layer 220 of FIG. 2) may be formed over the OLED layer. In various embodiments, as described above, the conductive shielding layer may be configured to reduce electrical noise coupling between the TFT substrate and the touch panel layer. In some embodiments, the touch panel layer may include one or more layers of touch sensor electrodes (e.g., touch sensor electrodes 222 of FIG. 2). Also, in some embodiments, the touch sensor electrodes may form a rectangular or diamond-shaped grid pattern to facilitate proximity detection by a finger, stylus, or the like. Other layers, such as a glass layer or other protection layers, may be formed over the touch panel layer in some examples.

Embodiments of the present invention are applicable to many display devices to permit such devices to be advantageously thin (e.g., to reduce the amount of device space dedicated to the display) while reducing or substantially eliminating the coupling of electrical noise from various display elements to the touch electrodes responsible for providing touchscreen functionality. Examples of such touch-sensitive devices include mobile phones, personal digital assistants (PDAs), tablet and laptop computers, and like devices for which a thin, touch-sensitive, high-resolution display is desirable.

From the above discussion, it is evident that various techniques can be utilized for implementing the concepts of the present disclosure without departing from the scope of those concepts. Moreover, while the concepts have been described with specific reference to certain implementations, a person of ordinary skill in the art would recognize that changes can be made in form and detail without departing from the scope of those concepts. As such, the disclosure is to be considered in all respects as illustrative and not restrictive. It should also be understood that the present disclosure is not limited to the particular described implementations, but that many rearrangements, modifications, and substitutions are possible without departing from the scope of the present disclosure.

What is claimed is:

1. An organic light-emitting device (OLED) display comprising:
   a thin-film transistor (TFT) substrate comprising:
      a plurality of TFTs; and
      a plurality of data lines that controls the plurality of TFTs;
   a conductive shielding layer disposed over the TFT substrate;
   an OLED layer disposed over the conductive shielding layer, the OLED layer comprising a plurality of OLEDs that is driven by the plurality of TFTs; and
   a touch panel layer disposed over the OLED layer, the conductive shielding layer being configured to reduce noise coupling between the TFT substrate and the touch panel layer,
   wherein the conductive shielding layer is held at a direct-current (DC) bias voltage.

2. The OLED display of claim 1, wherein the conductive shielding layer is capacitively coupled with at least one of the plurality of data lines.

3. The OLED display of claim 1, wherein the conductive shielding layer comprises a plurality of traces extending parallel to the TFT substrate.

4. The OLED display of claim 3, wherein each of the plurality of traces is positioned vertically over and aligned with at least a portion of at least one of the plurality of data lines.

5. An organic light-emitting device (OLED) display comprising:
   a thin-film transistor (TFT) substrate comprising:
      a plurality of TFTs; and
      a plurality of data lines that controls the plurality of TFTs;
   a conductive shielding layer disposed over the TFT substrate;
   an OLED layer disposed over the conductive shielding layer, the OLED layer comprising a plurality of OLEDs that is driven by the plurality of TFTs; and
   a touch panel layer disposed over the OLED layer, the conductive shielding layer being configured to reduce noise coupling between the TFT substrate and the touch panel layer,
   wherein the plurality of OLEDs comprises at least one cathode electrode that carries return current from the plurality of OLEDs.

6. The OLED display of claim 5, wherein the at least one cathode electrode comprises a single conductive layer coupling multiple ones of the plurality of OLEDs.

7. The OLED display of claim 5, wherein the at least one cathode electrode is capacitively coupled with the conductive shielding layer.

8. The OLED display of claim 5, wherein:
the at least one cathode electrode has a first resistivity; and
the conductive shielding layer has a second resistivity lower than the first resistivity.

9. The OLED display of claim 5, wherein the at least one cathode electrode and the conductive shielding layer are held at a first DC voltage.

10. The OLED display of claim 5, wherein:
the OLED layer further comprises an encapsulation layer disposed over the at least one cathode electrode; and
the touch panel layer is deposited atop the encapsulation layer.

11. The OLED display of claim 10, wherein the encapsulation layer comprises a thin-film encapsulation (TFE) layer.

12. The OLED display of claim 5, wherein:
the touch panel layer comprises at least one touch panel electrode; and
the at least one touch panel electrode is capacitively coupled with the at least one cathode electrode.

13. The OLED display of claim 12, wherein the at least one touch panel electrode forms a pattern across two dimensions within the touch panel layer.

14. A method of constructing an organic light-emitting device (OLED) display, the method comprising:
forming a conductive shielding layer over a thin-film transistor (TFT) substrate, the TFT substrate comprising:
a plurality of TFTs; and
a plurality of data lines that controls the plurality of TFTs;
forming an OLED layer over the conductive shielding layer, the OLED layer comprising a plurality of OLEDs that is driven by the plurality of TFTs; and
forming a touch panel layer over the OLED layer, the conductive shielding layer being configured to reduce noise coupling between the TFT substrate and the touch panel layer, wherein:
forming the OLED layer comprises forming at least one cathode electrode to carry return current from the plurality of OLEDs, the plurality of OLEDs comprising the at least one cathode electrode; and
the conductive shielding layer is capacitively coupled to the at least one cathode electrode.

15. The method of claim 14, further comprising connecting the conductive shielding layer to a direct-current (DC) bias voltage source.

16. The method of claim 15, further comprising connecting the at least one cathode electrode to the DC bias voltage source.

17. The method of claim 14, wherein the conductive shielding layer is further capacitively coupled with the plurality of data lines.

18. The method of claim 17, wherein:
forming the conductive shielding layer comprises forming a plurality of traces extending parallel to the TFT substrate; and
each of the plurality of traces is placed vertically over and aligned with at least a portion of at least one of the plurality of data lines.

* * * * *